United States Patent
Blodgett

(10) Patent No.: US 6,614,298 B2
(45) Date of Patent: Sep. 2, 2003

(54) APPARATUS AND METHOD FOR CONTROLLING ADAPTIVE CIRCUITS

(75) Inventor: James R. Blodgett, Walnut Creek, CA (US)

(73) Assignee: SOMA Networks, Inc., San Francisco, CA (US)

(*) Notice: Subject to any disclaimer, the term of this patent is extended or adjusted under 35 U.S.C. 154(b) by 0 days.

(21) Appl. No.: 10/016,691

(22) Filed: Dec. 17, 2001

(65) Prior Publication Data

US 2003/0034834 A1 Feb. 20, 2003

Related U.S. Application Data

(60) Provisional application No. 60/311,358, filed on Aug. 13, 2001.

(51) Int. Cl.[7] .................................................. H03F 3/66
(52) U.S. Cl. .......................................... 330/52; 330/151
(58) Field of Search ........................... 330/52, 149, 151

(56) References Cited

U.S. PATENT DOCUMENTS

| | | | |
|---|---|---|---|
| 3,471,798 A | 10/1969 | Seidel | 330/149 |
| 3,649,927 A | 3/1972 | Seidel | 330/124 |
| 5,093,668 A | 3/1992 | Sreenivas | 342/374 |
| 5,386,198 A | * 1/1995 | Ripstrand et al. | 330/52 |
| 5,491,454 A | 2/1996 | Matz | 330/149 |
| 5,576,659 A | * 11/1996 | Kenington et al. | 330/52 |
| 5,768,699 A | 6/1998 | Behan et al. | 455/296 |
| 5,796,304 A | 8/1998 | Gentzler | 330/52 |
| 5,870,668 A | 2/1999 | Takano et al. | 455/126 |
| 5,874,856 A | 2/1999 | Van Horn | 330/151 |
| 5,926,067 A | 7/1999 | Myer et al. | 330/52 |
| 5,963,091 A | 10/1999 | Chen et al. | 330/151 |
| 5,977,825 A | 11/1999 | Mueck | 330/151 |
| 6,166,600 A | 12/2000 | Myer | 330/151 |
| 6,208,204 B1 | 3/2001 | Suzuki et al. | 330/52 |
| 6,340,915 B1 | 1/2002 | Blodgett | 330/52 |

\* cited by examiner

Primary Examiner—Steven J. Mottola
(74) Attorney, Agent, or Firm—Katten Muchin Zavis Rosenman

(57) ABSTRACT

An apparatus and method for operating an adaptive circuit includes injecting a set of orthogonal tracer signals into the circuit. The tracers signals are extracted after modification by at least a portion of the circuit and are examined by respective controllers to modify operation of the circuit. In one embodiment, the invention is incorporated into a feed forward amplifier where a set of orthogonal tracer signals are injected into the amplifier. A detector controller detects the orthogonal tracer signals, as modified by portions of the amplifier, and applies each tracer signal to a respective controller. Each controller examines its respective signal and modifies its output to control a portion of the amplifier accordingly. The controllers apply their outputs to the respective portions of the amplifier at substantially the same time, leading to quick convergence of the operating point of the amplifier to an optimal or near-optimal configuration. Injection of the tracer signals into the amplifier is accomplished by dithering the controller outputs by the respective orthogonal tracer signals.

11 Claims, 6 Drawing Sheets

APPARATUS AND METHOD FOR CONTROLLING ADAPTIVE CIRCUITS

PRIORITY CLAIM

The present application claims priority from U.S. provisional patent application No. 60/311,358, filed Aug. 13, 2001, the contents of which are incorporated herein by reference.

FIELD OF THE INVENTION

The present invention relates to adaptive circuits. More specifically, the present invention relates to an apparatus and method for controlling adaptive circuits, such as controlling gain and phase adjustments in a feed forward amplifier circuit.

BACKGROUND OF THE INVENTION

Adaptive circuits are well known and used in a variety of applications. One well known example of an adaptive circuit is the feed forward amplifier ("FFA"). In order to achieve linearity in a feed forward amplifier, careful control of the amplifier circuitry is required. In particular, in FFA's two or more gain and phase adjusters are often employed and the taps of each of these adjusters are carefully steered to achieve linearity through the amplifier.

Within the art of FFAs, it is known to use detector-controller circuits, one for each gain-and-phase adjuster. Each detector-controller circuit is operable to steer the taps of its respective gain-and-phase adjuster in the FFA so that the main amplifier and correctional amplifier can properly cooperate in order to reduce error introduced by the main amplifier and, should a pilot tone be used in the FFA, to also reduce the pilot tone injected prior to the main amplifier.

In certain prior art detector-controller circuits, once the detector portion of the detector-controller circuit has indicated that the associated controller circuit should make an adjustment, the controller arbitrarily steers the taps of the gain-and-phase adjuster in a direction to either increase or decrease the input to the tap, without knowing which of an increase or decrease will actually achieve the desired effect. In order to verify whether the controller steered the tap in the correct direction (e.g.—increased the signal to the tap), the detector circuit ascertains whether the direction of the variation brought about the desired effect, and, if so, instructs the controller circuit to continue steering in the same direction. If, however, the detector circuit ascertains that the steering direction brought about an undesired result, then the detector instructs to the controller to try steering the tap in the opposite direction (e.g.—decrease the signal to the tap)

In the prior art, each detector-controller circuit works independently of each other, and therefore achieving convergence towards an optimum level for each tap of each adjuster can be difficult. For example, rapid changes to the input signal being amplified by the FFA can make it difficult for the detector-controller circuits to respond quickly enough to converge the tap levels of each gain-and-phase adjuster towards the respective optimum levels. Furthermore, the adjustment of one tap of a gain-and-phase adjuster can disrupt an optimum or near optimum input level achieved at another tap, therefore cascading disruptions through all of the taps.

The inventor of the present invention also believes that a further problem is that such prior art controller circuits tend to result in taps being steered to levels that are levels corresponding to local minima for the input signal, missing a global optimum for the input signal.

SUMMARY OF THE INVENTION

It is an object of the present invention to provide a novel apparatus and method for controlling an adaptive circuit that obviates or mitigates at least one of the above-identified disadvantages of the prior art. It is a further object of the present invention to provide a novel feed forward amplifier that obviates or mitigates at least one of the above-identified disadvantages of the prior art.

In one aspect of the present invention, there is provided an adaptive circuit comprising: at least two adjusters, each adjuster including at least one control input to alter the operation of the circuit; at least one signal generator to create a tracer signal, each created tracer signal being orthogonal to each other created tracer signal; at least two controllers, each controller operable to output a control signal to at least a respective one of the control inputs of the at least two adjusters, a different orthogonal tracer signal from said at least one signal generator being applied to each respective control signal as a dither; and at least one detector operable to extract at least one orthogonal tracer signal from the circuit and to apply the extracted at least one orthogonal tracer signal to a respective one of the at least two controllers, each controller being responsive to the respective applied signal to alter the respective control signal to converge operation of the circuit to an optimal or near optimal configuration.

Preferably, the at least two adjusters operate to adjust the phase and gain of a signal passed through them and each of the at least two adjusters includes a phase control input tap to control the phase adjustment and a gain control input tap to control the gain adjustment.

Also preferably, the adaptive circuit includes at least two detectors, each of which extracts at least two orthogonal tracer signals and applies the extracted orthogonal tracer signals to a respective one of the phase control input tap and the gain control input tap of a respective adjuster.

While it is presently preferred that the orthogonal tracer signals are Walsh codes, other orthogonal, or near orthogonal, signals such as pseudo noise sequences can be employed.

According to another aspect of the present invention, there is provided a feed forward amplifier comprising: an amplifier portion including a coupler, first and second gain and phase adjusters, first and second delay elements, a main amplifier and a correctional amplifier, the coupler providing an input signal to said amplifier portion to a first signal path including the first gain and phase adjuster, the main amplifier and the first delay element and an output and the coupler providing the input signal to a second signal path including the second delay element, the second gain and phase adjuster and the correctional amplifier having a first signal path for carrying an input signal to a first gain-and-phase adjuster and a main-amplifier, said first gain-and-phase adjuster having a pair of taps for steering said first adjuster, said amplifier portion having a second signal path for carrying a sample of said input signal generated to a second gain-and-phase adjuster and a correctional-amplifier, said second gain-and-phase adjuster having a pair of taps for steering said adjuster; and a detector-controller portion having a first detector for receiving a detected signal from said first signal path and a second detector for receiving a detected signal from said second signal path, said detector-controller portion further comprising a first pair of controllers for receiving said detected signal from said first detector and a second pair of controllers for receiving said detected signal from said second detector, said controllers each operable to steer a respective one of said taps based on said received detected signals, each of said controllers further operable to inject tracer-signals into its respective tap, said tracer-signals for carrying through said amplifier portion and modulating said detected signals, said controllers each operable to extract from its respective detected signals a tap-signal by using its respective said tracer-signal, said controllers each further operable to utilize said extracted tap-signal to determine a desired direction for steering its respective tap and to output, substantially simultaneously with each other controller, a signal to steer said respective tap.

According to yet another aspect of the present invention, there is provided a feed forward amplifier comprising:

an amplifier portion including:

(a) a first signal path having a first gain and phase adjuster, a main amplifier and a delay element; and (b) a second signal path having a delay element, a second gain and phase adjuster and a correctional amplifier, each gain and phase adjuster including a control input tap to accept an input to alter the phase response of the gain and phase adjuster and a control input tap to accept an input to alter the gain response of the gain and phase adjuster, the first and second signal paths having a common signal input and a common signal output; and a detector portion including:

(c) a first detector to receive a signal from the common signal output and to provide the received signal to a first controller operable to create an input to the gain tap of the second gain and phase adjuster and to provide the received signal to a second controller operable to create an input to the phase tap of the second gain and phase adjuster; and (d) a second detector to receive a signal from the second signal path before the second gain and phase adjuster and to provide the received signal to a first controller operable to create an input to the gain tap of the first gain and phase adjuster and to provide the received signal to a second controller operable to create an input to the phase tap of the first gain and phase adjuster, each controller responsive to a component in said received signals which is orthogonal to the components to which each other controller are responsive to and all the created inputs being applied to the taps substantially simultaneously and altering the operation of said feed forward amplifier to linearize the amplification of the input signal through the feed forward amplifier.

According to yet another aspect of the present invention, there is provided a method for operating an adaptive control circuit having a plurality of control input taps, said method comprising, for each said control input, the steps of: detecting a signal, including a tracer signal, from said circuit; extracting a measurement from the tracer signal in said detected signal; determining an appropriate input to be applied to said control input to improve operation of said adaptive circuit; creating a tracer signal for said control input, said created tracer signal being orthogonal to the tracer signals created for each other control input; and combining said tracer signal and said determined input and applying the resulting signal to said control input.

An apparatus and method for operating an adaptive circuit includes injecting a set of orthogonal tracer signals into the circuit. The tracers signals are extracted after modification during operation of at least a portion of the circuit and are examined by respective controllers to modify operation of the circuit.

In one embodiment, the invention is incorporated into a feed forward amplifier where a set of orthogonal tracer signals are injected into the amplifier. A detector controller detects the orthogonal tracer signals, as modified by portions of the amplifier, and applies each tracer signal to a respective controller. Each controller examines its respective signal and modifies its output to control a portion of the amplifier accordingly. The controllers apply their outputs to the respective portions of the amplifier at substantially the same time, leading to quick convergence of the operating point of the amplifier to an optimal, or near-optimal, configuration. Injection of the tracer signals into the amplifier is accomplished by dithering the controller outputs by the respective orthogonal tracer signals.

BRIEF DESCRIPTION OF THE DRAWINGS

Preferred embodiments of the present invention will now be described, by way of example only, with reference to the attached Figures, wherein.

DETAILED DESCRIPTION OF THE INVENTION

Figure 1:
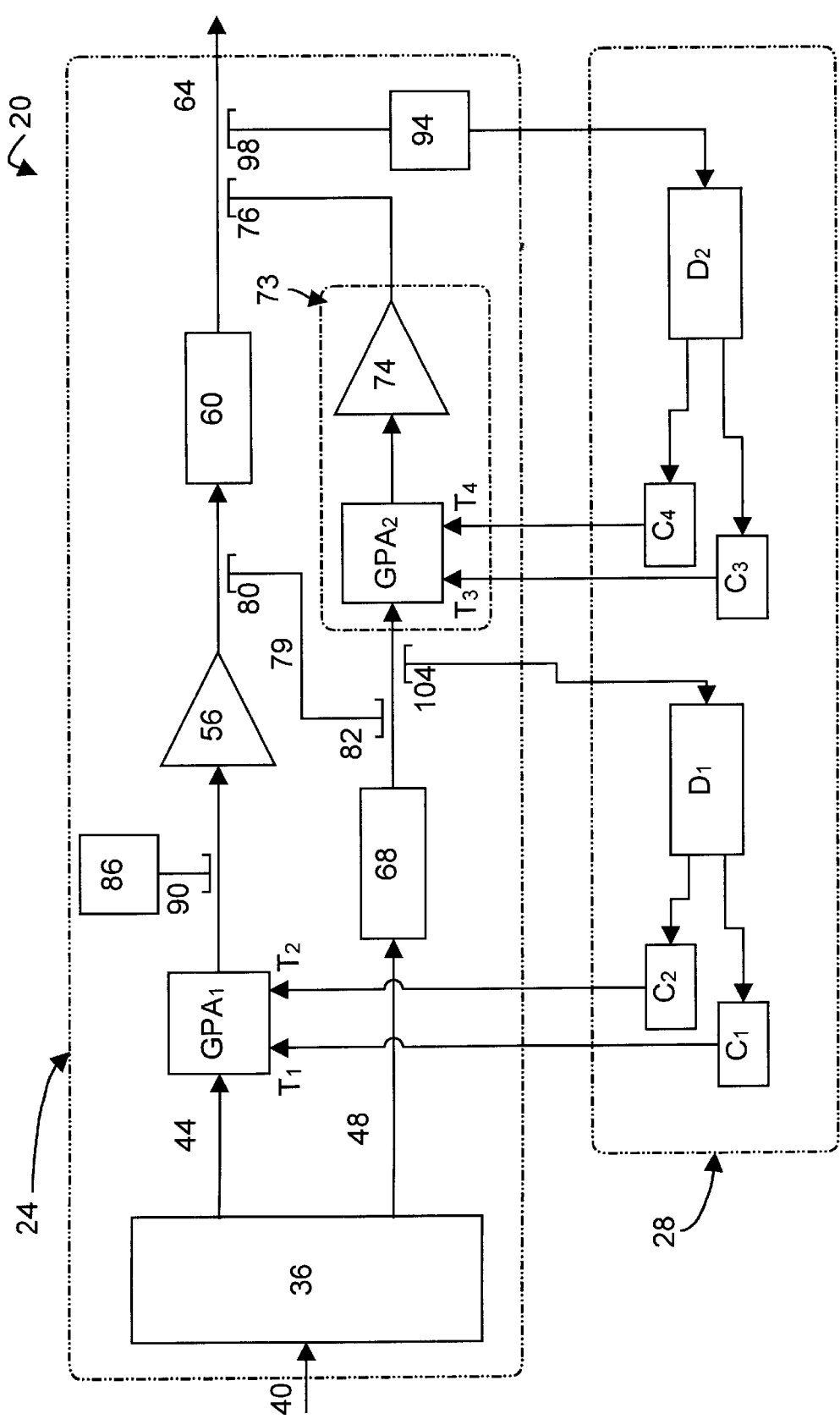
FIG. 1 is a block diagram of a feed forward amplifier in accordance with an embodiment of the present invention.

Referring now to FIG. 1, a forward feed amplifier ("FFA") in accordance with an embodiment of the invention is indicated generally at 20. FFA 20 comprises an amplifier portion 24 and a detector-controller portion 28. Amplifier portion 24 includes a coupler 36 that is connected to an input signal path 40. Coupler 36 is operable to split an incoming signal from path 40 into a main amplifier signal path 44 and a correctional amplifier signal path 48.

Main amplifier signal path 44, which carries the main signal from coupler 36, includes a gain and phase adjuster $GPA_1$, a main amplifier 56 and a delay element 60 that outputs to an output signal path 64. $GPA_1$ includes a gain control input tap $T_1$, and a phase control input tap $T_2$, each of which can be steered so that $GPA_1$ operates to yield maximum signal cancellation at the output of coupler 82, at the input of coupler 104, as discussed below. As used herein, the terms "steer", "steered" and "steering" are intended to comprise all suitable methods of adjusting and/or controlling of the taps respective to a gain and phase adjuster.

Correctional amplifier signal path 48 which carries a sample, generated by coupler 36, of the signal from input signal path 40 includes a delay element 68, a gain and phase adjuster $GPA_2$ and a correctional amplifier 74, the output of which connects to output signal path 64 via a coupler 76. $GPA_2$ includes a gain control input tap $T_3$, and a phase control input tap $T_4$, each of which can be steered so that $GPA_2$ is adjusted to require a minimum, or near minimum, amount of power to be delivered to the correctional amplifier 74.

As will be apparent to those of skill in the art, $GPA_2$ and correctional amplifier 74 form an error pathway 73 within amplifier portion 24. Accordingly, when the output of correctional amplifier 74 is coupled to the output of delay 60 errors and pilot tones, if used, are substantially eliminated from the output signal path 64, such that the output signal path 64 presents a substantially linear amplification of the signal from input signal path 40.

Amplifier portion 24 is further characterized by a coupled path 79 that interconnects a first coupler 80, which is connected to the output of main amplifier 56, and a second coupler 82, which is connected to the output of delay element 68, in order to provide a sample of the error introduced by main amplifier 56 to the error pathway 73, commencing at $GPA_2$.

In a present embodiment, amplifier portion 24 further includes a pilot tone generator 86 that is coupled, via a coupler 90, to the input of main amplifier 56. Pilot tone generator 86 generates a pilot tone for use by error pathway 73 in the usual manner for reducing error introduced by main amplifier 56. By the same token, amplifier portion 24 further includes a pilot tone receiver 94 that is coupled, via a coupler 98, to output signal path 64. Pilot tone receiver 94 is operable to measure any remaining pilot tone present along output signal path 64 for eventual use by error pathway 73 to introduce a signal at coupler 76 that will reduce the pilot tone in output signal path 64.

Detector-controller portion 28 connects to amplifier portion 24 through various inputs and various outputs, as described herein. Specifically, a coupler 104 connected just prior to error pathway 73 delivers an input signal to a first detector $D_1$, which in turn presents a detector-output to a gain controller $C_1$ and a phase controller $C_2$. Detector $D_1$ measures the dither, or other tracer signal, on the signal applied to it, as discussed below.

Similarly, pilot tone receiver 94 delivers an output signal to a second detector $D_2$ which in turn presents a detector-output to a gain controller $C_3$ and a phase controller $C_4$. Again, detector $D_2$ measure the dither, or other tracer signal, on the signal applied to it. As will be discussed in greater detail below, controllers $C_1$, $C_2$, $C_3$ and $C_4$ are operable to steer taps $T_1$, $T_2$, $T_3$ and $T_4$, respectively, based on the signals received from their respective detectors D, in order to find optimum (or otherwise desired) gain and phase adjustments for each of adjusters $GPA_1$ and $GPA_2$.

In the illustrated embodiment, tracer signals are injected into each of main amplifier signal path 44 and correctional amplifier signal path 48 and they are detected by detectors $D_1$ and $D_2$, after passing through main amplifier 56 and/or correctional amplifier 74, and are passed to the respective controllers C to steer the taps of the respective gain and phase adjusters accordingly. Each tracer signal is designed to be orthogonal to each other tracer signal and thus a separate tracer signal can be associated with each gain and phase adjuster tap T. As described below, in the illustrated embodiment each tracer signal is coded with a Walsh code to achieve orthogonality, but other techniques, such as selecting appropriate pseudo noise sequences, to render the tracer signals orthogonal to each other will be apparent to those of skill in the art. As will become apparent to those of skill in the art from the discussion herein, the present invention will operate with tracer signals that are not totally orthogonal to each other, although better performance will be obtained when using signals as orthogonal as possible. Accordingly, as used herein, the term orthogonal is intended to include both perfectly orthogonal signals, such as Walsh codes, and near-orthogonal signals, for example pseudo noise sequences taken over a time period which provides approximately orthogonal results.

Figure 2:
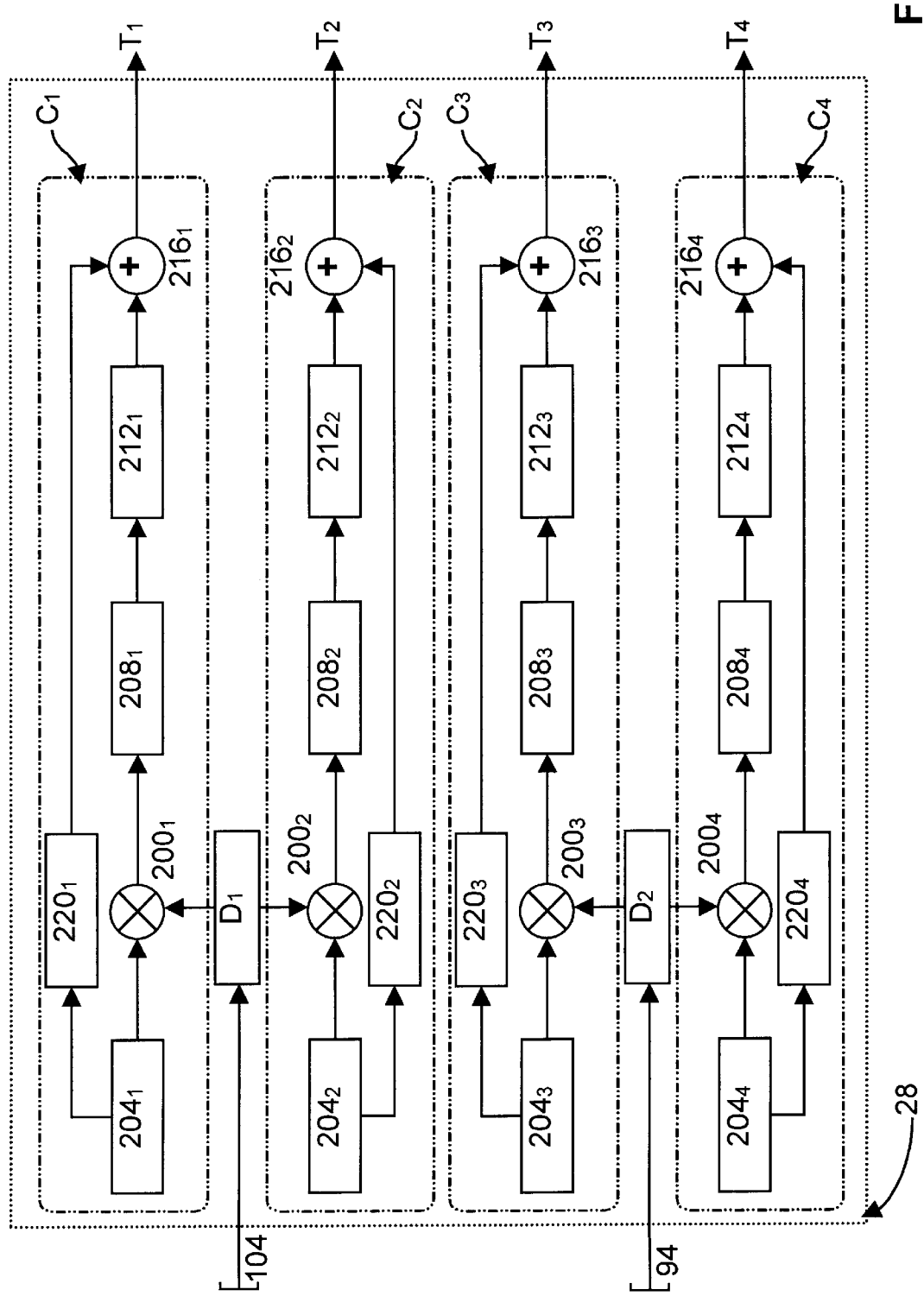
FIG. 2 is a block diagram of a detector-controller portion of the amplifier shown in FIG. 1.

Referring now to FIG. 2, detector-controller portion 28 will now be discussed in greater detail. As shown, controllers $C_1$, $C_2$, $C_3$ and $C_4$ each include the same components. Each controller C includes a multiplier 200 that receives a detector-output from a respective detector D. Controllers C are operable to utilize the detector-output to determine how to steer their respective tap T. In the present embodiment, a detector-output includes a signal that is composed of two or more individual tracer signals comprising Walsh code signals, (each individual Walsh code signal corresponding to one of each tap T), which are combined with each other. The polarity of the Walsh code in the detected signal relative to the original Walsh code determines whether a particular tap T has been steered in the correct direction. These and other details of the detector-output are discussed in greater detail further below.

To extract the tracer signal for the controller C, each multiplier 200 receives its Walsh code from a Walsh code generator 204. Each Walsh code generator $204_1$, $204_2$, $204_3$ and $204_4$, generates a unique Walsh code, which, as is understood by those of skill in the art, is a predetermined pattern of one or more logical ones and/or logical zeroes that repeat over a given period and is orthogonal to each other Walsh code. As will be discussed in greater detail below, when the detector-output from a respective detector D is multiplied by multiplier 200 with a respective Walsh code, only the portion of the detector-output associated with the respective tap T will be output from the respective multiplier 200.

Controllers C also each include an integrator 208 which is operable to sum the results from multiplier 200, which represent the extracted tracer signal for the respective tap T, for each period and output those summed results to an adjuster 212 which is operable to determine from the summed result whether the tap T it is responsible for was properly steered. If an adjuster 212 determines that its corresponding tap T was steered in the proper direction, then adjuster 212 outputs a signal that continues to steer that tap T in the same direction. If adjuster 212 determines that its corresponding tap T was steered in the wrong direction, then adjuster 212 outputs a signal that steers that tap T in the opposite direction. Adjuster 212 can also determine that the tap T is at an optimum level, in which case adjuster 212 does not steer tap T at all, but leaves the tap steering signal at the existing level. Further details of adjuster 212 will be discussed in greater detail below.

To inject the tracer signal for a controller C into amplifier portion 24, the signal outputted from adjuster 212 is modulated, using a summer 216, with the Walsh code generated at Walsh code generator 204, the Walsh code having first been attenuated through an attenuator 220 by a factor A. The Walsh code is attenuated, by factor A, to a level that provides a suitable "dither" or "perturbance" that can be summed with the control signal from adjuster 212 for the respective tap T. The voltage level of each Walsh code is, after being added at summer 216, at a level which will generally yield a minimum reliably detectable signal at the output of detector D.

As will be apparent to those of skill in the art, in order for the Walsh code to behave as a good dither, each Walsh code for each controller C is selected to have as many transitions as possible, while still being orthogonal to the Walsh codes of the other controllers C. Also, as the tracer signal is averaged over a suitable period of time to reduce the effects of noise in the detected signal, it is desired to choose a Walsh code, or other orthogonal signal, with a suitably long length. It is presently preferred that a length for the Walsh codes is selected which is at least twice the number taps T to be controlled, i.e.—in the embodiment of FIG. 1, the shortest desired length of Walsh codes would be an eight chip code and, in fact, it is presently preferred to use a Walsh code length of sixty-four chips for a feed forward amplifier with four taps T.

The output of each summer 216 is then presented to its respective tap T, thereby steering each respective tap T accordingly and injecting the respective tracer signal.

Figure 3:
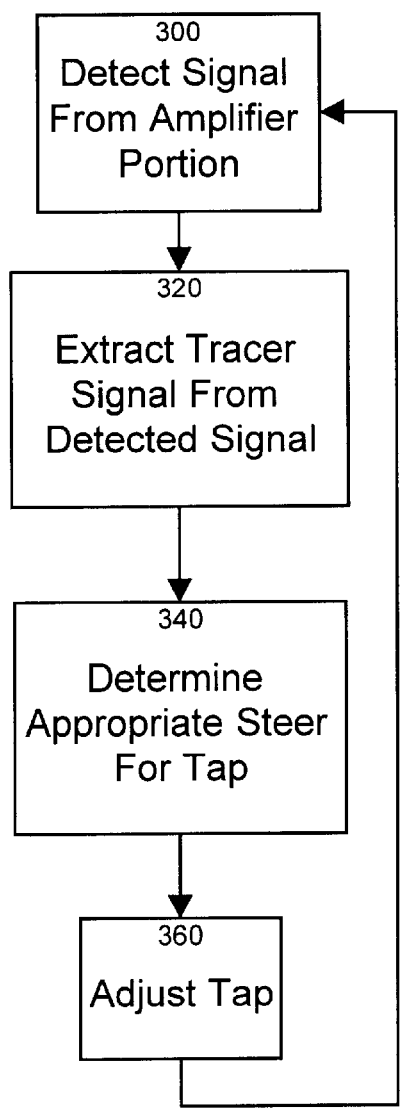
FIG. 3 is a flow chart showing a method of controlling the gain and phase adjustment of the amplifier of FIG. 1.

A method of controlling the gain and phase adjustment of feed forward amplifier 20 will now be discussed with reference to FIG. 3. The flow-chart in FIG. 3 shows a sequence of steps which can be used to operate, for example, each controller C of detector-controller portion 28, thereby steering each tap T. In other words, the sequence of steps in FIG. 3 will be performed, in parallel, for each controller C.

Figure 4:
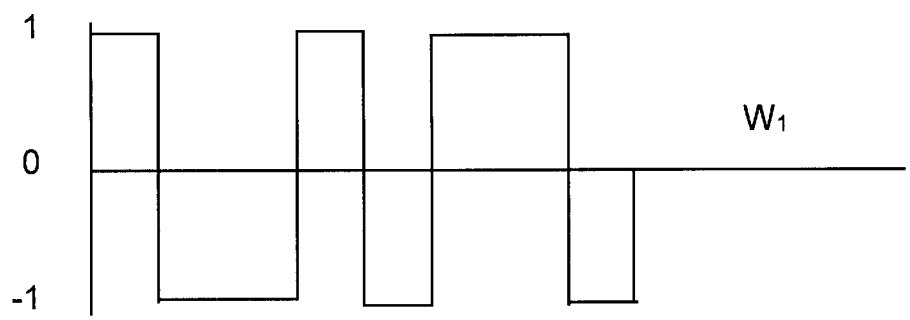
FIG. 4 is an exemplary set of Walsh codes for use in the detector-controller portion of the amplifier of FIGS. 1 and 2.
Figure 4:
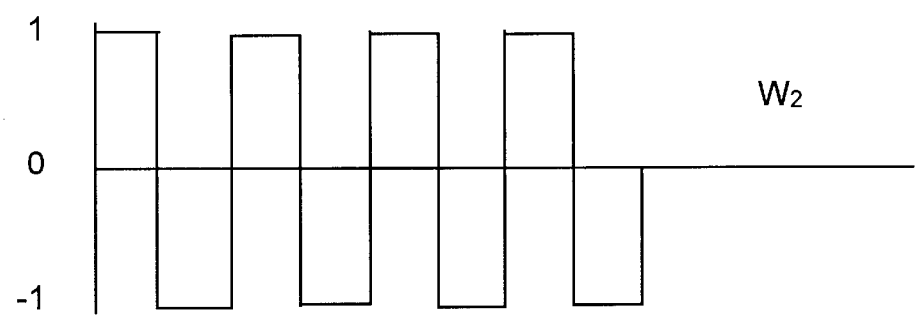
Figure 4:
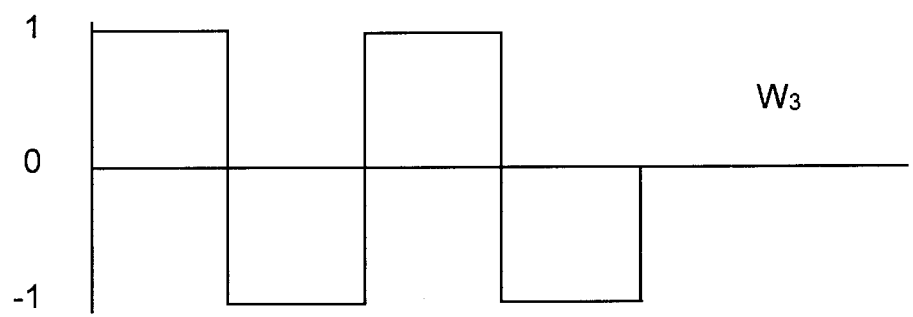
Figure 4:
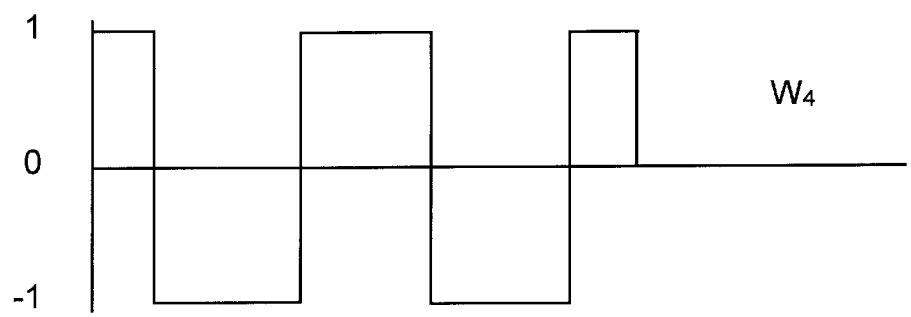

Although, as mentioned above, in a presently preferred embodiment each Walsh code is actually sixty-four chips in length, for simplicity while explaining the method, it will be assumed that each Walsh code $W_1$, $W_2$, $W_3$ and $W_4$, is only eight chips in length. Each Walsh code $W_1$, $W_2$, $W_3$ and $W_4$ is generated by a respective Walsh code generators $204_1$, $204_2$, $204_3$ and $204_4$ and is shown in Table I and illustrated in the pulse-waveforms shown in FIG. 4.

From the waveforms shown therein, it is to be understood that a "1" means a logical "1", and "−1" means a logical "0".

TABLE I

| Chip | $W_1$ | $W_2$ | $W_3$ | $W_4$ |
|---|---|---|---|---|
| 1 | 1 | 1 | 1 | 1 |
| 2 | −1 | −1 | 1 | −1 |
| 3 | −1 | 1 | −1 | −1 |
| 4 | 1 | −1 | −1 | 1 |
| 5 | −1 | 1 | 1 | 1 |
| 6 | 1 | −1 | 1 | −1 |
| 7 | 1 | 1 | −1 | −1 |
| 8 | −1 | −1 | −1 | 1 |

Again for simplicity, the method of FIG. 3 will only be discussed in detail with reference to controllers $C_1$ and $C_2$ and their associated detector $D_1$. The method begins at step 300 where a signal is detected at detector $D_1$ from the amplifier portion 24 of feed forward amplifier 20. To illustrate how this step can be accomplished according to a present embodiment, it will be assumed that feed forward amplifier 20 has just been activated (i.e. initialized), but that no input signal is present along input signal path 40, and accordingly no output signal is present along output signal path 64.

Figure 5:
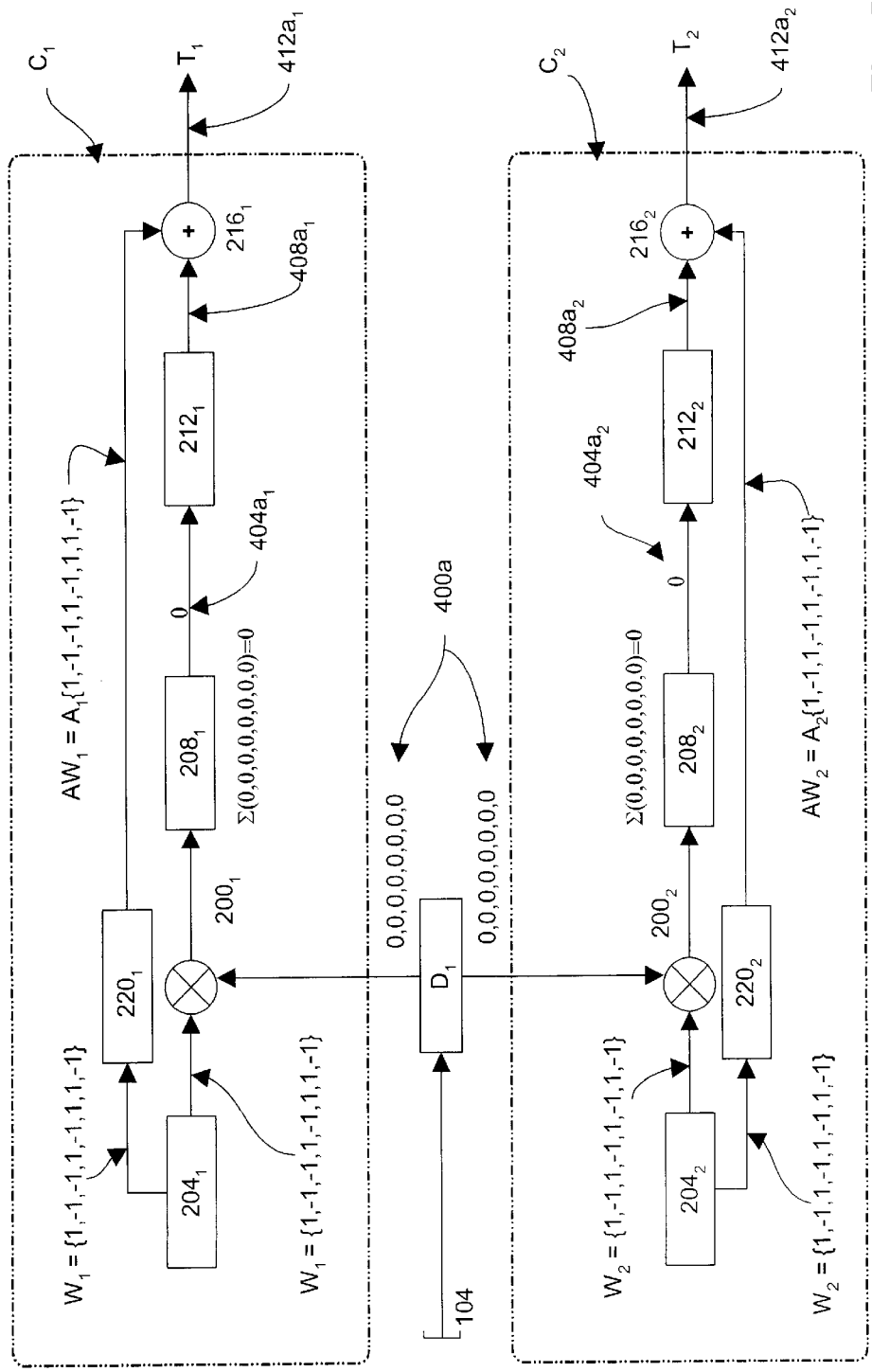
FIG. 5 shows an example of the operation of two of the controllers shown in FIG. 2 using the method of FIG. 3, during an initial power-on of the amplifier of FIG. 1.

The activity in feed forward amplifier 20 at this point in the method is illustrated in FIG. 5, where detector $D_1$, controller $C_1$ and controller $C_2$ are shown. As there is no input signal along input signal path 40, detector $D_1$ detects this and outputs a corresponding waveform, which is represented in FIG. 5 as a detector-output waveform 400a, which in turn is inputted into multiplier $200_1$ and multiplier $200_2$.

By way of further background to the operation of the present embodiment, it will be apparent to those of skill in the art that the tracer signal being applied to the taps T of gain and phase adjuster $GPA_1$, whether a Walsh code or any other dither, will only be detectable at detector $D_1$ where there is an input signal along input signal path 40 as the tracer signal is a modulation of the input signal. Similarly, if a pilot tone is being injected at coupler 90, then the tracer signal applied at the taps T of $GPA_2$ will be detectable at detector $D_2$ as modulation of the pilot tone detected at detector $D_2$. As there is as yet no input signal in FIG. 5, detector-output waveform 400a is all zeros, as shown.

Referring again to FIG. 3, the method then advances to step 320 where the tracer signal for the tap $T_1$ respective to the controller $C_1$ is extracted from the signal detected at step 300. In a present embodiment, this signal is extracted from detector-output waveform 400a using multiplier 200 and integrator 208. First, multiplier 200 multiplies the Walsh code output from Walsh code generator 204 with the detector-output waveform 400a to extract the tracer signal. The product waveform is presented to integrator 208, which sums each pulse in the waveform over the number chips in the Walsh code. The output for each integrator $208_1$, $208_2$ are represented on FIG. 5 as items $404a_1$ and $404a_2$, respectively.

Specifically, for controller $C_1$, since the detector-output 400a={0, 0, 0, 0, 0, 0, 0, 0}, and since the output of Walsh code generator $204_1$ can be represented by the series $W_1$={1, −1, −1, 1, −1, 1, 1, −1}, then the output of multiplier $200_1$ can be represented as {0, 0, 0, 0, 0, 0, 0, 0}×{1, −1, −1, 1, −1, 1, 1, −1}=(0, 0, 0, 0, 0, 0, 0, 0). The result $404a_1$, from integrator $208_1$ can be represented as $404a_1$=(0, 0, 0, 0, 0, 0, 0, 0)=0.

Similarly, for controller $C_2$, since detector-output 400a= {0, 0, 0, 0, 0, 0, 0, 0} and since the output of Walsh-code generator $204_2$ can be represented by the series $W_2$={1, −1, 1, −1, 1, −1, 1, −1}, then the output of multiplier $200_2$ can be represented as {0, 0, 0, 0, 0, 0, 0, 0}×{1, −1, 1, −1, 1, −1, 1, −1}=(0, 0, 0, 0, 0, 0, 0, 0). The result $404a_2$, from integrator $208_2$ can be represented as $404a_2$=(0, 0, 0, 0, 0, 0, 0, 0)=0.

Referring again to FIG. 3, the method then advances to step 340 where the appropriate steering signal for the tap $T_1$ respective to a given controller $C_1$ is determined. In the present embodiment, this step is performed by adjuster 212. Continuing with the above example being discussed with reference to FIG. 5, the result 404a from each integrator 208 is then passed to its respective adjuster 212. As shown in the example of FIG. 5, the result 404a from each integrator 208 was "0", and this value is passed to adjuster 212.

In the present embodiments, adjuster 212 includes digital signal processing circuitry which is operable to make the determination of whether and how to steer the tap T based on the result 404a passed from its respective integrator 208. Adjuster 212 determines from the received "0" input that no steering of a tap T is required and the method advances to step 360, wherein no adjustment is made to the steering signal applied to the respective tap T.

If adjuster 212 had received a positive or negative input from the result 404a, then an appropriate adjustment to the tap steering signal would be determined and the method would have advanced to step 360 where the appropriate adjustment of the steering signal is applied to the respective tap T.

Continuing with the example being discussed in conjunction with FIG. 5, as it was determined at step 340 that no adjustment to the steering signal was required, and as feed forward amplifier 20 has just been activated, adjuster 212 determines that the tap T for its respective controller C should remain in its nominal position. Each adjuster 212 then outputs a corresponding tap steering signal, indicated on FIG. 5 as signals $408a_1$ and $408a_2$. The exact format of tap steering signals 408 can be generated using known means and circuitry and need only correspond with the format required to control the specific type of gain and phase adjusters used within amplifier portion 24.

Tap steering signals 408a are then presented to their respective summer 216, which sums the tap steering signal 408a with an attenuated version AW of the Walsh code W. This attenuated Walsh code is indicated on FIG. 5 as items $AW_1$ and $AW_2$ and is the tracer signal to be injected in the signal paths of amplifier portion 24 for the next iteration of the control method. It will be apparent to those of skill in the art that the factors A for each attenuator 220 can differ from each other. Attenuated Walsh codes AW are attenuated by factors A to a level, appropriate for the specific GPA employed, so they act as a "dither" modulated on top of its tap steering signal 408a and that operation of the gain and phase GPA is not impeded by the dither.

Attenuated Walsh codes AW are produced by attenuators 220, which simply receive the output of their respective Walsh code generator 204 and generate and output an attenuated version thereof to their respective summers 216. Thus, each tap steering signal 408a and respective attenuated Walsh code AW are combined by their respective summer 216, to create a dithered tap steering signal, indicated on FIG. 5 as items $412a_1$ and $412a_2$. At step 360, the dithered tap steering signals $412a_1$, $412a_2$ are then presented to their respective taps $T_1$, $T_2$ of $GPA_1$ and the method then returns to step 300, where another iteration of the method begins.

As mentioned above, the method shown in FIG. 3 operates simultaneously for detector $D_2$ and controllers $C_3$ and $C_4$ in the same manner as that described above for detector $D_1$ and controllers $C_1$ and $C_2$. Thus, steering adjustments can be effected at each tap T at the same time.

Figure 6:
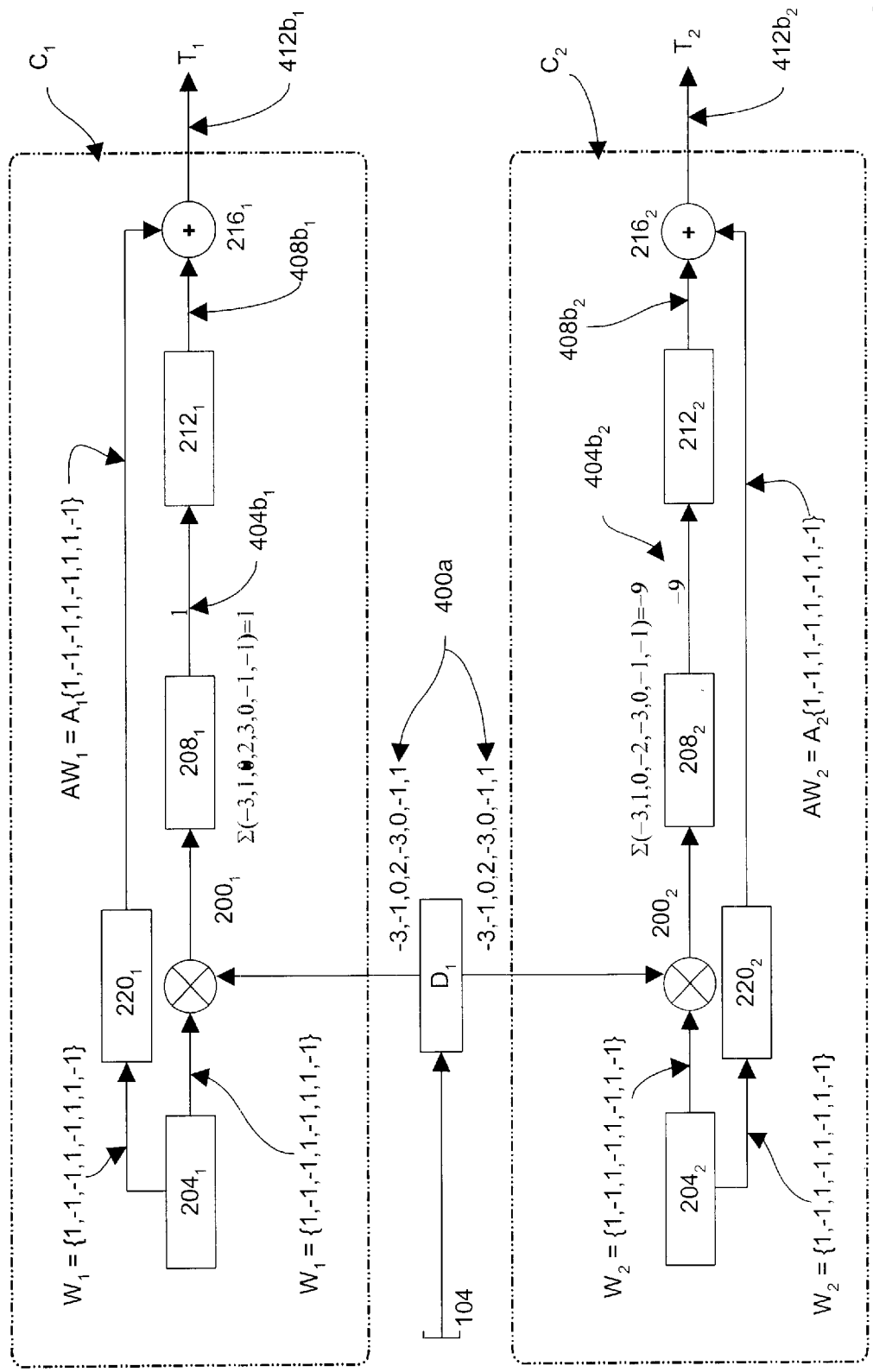
FIG. 6 shows an example of the operation of the controllers shown in FIG. 5 during a subsequent iteration through the method shown of FIG. 3.

An example of a second iteration through the method of FIG. 3 will now be discussed with reference to FIG. 6. It is assumed that, prior to this iteration an input signal is being input along input signal path 40. FIG. 6 again shows detector $D_1$ and controllers $C_1$ and $C_2$. This iteration commences with step 300 again being performed by detector $D_1$. As there is now an input signal along input signal path 40, detector $D_1$ now detects the tracer signal (dither) which has been applied to at least one of the gain and phase adjusters and reflects this detection in detector-output waveform 400b. For purposes of explaining the present embodiment, it will be assumed that detector-output waveform 400b is {-3, -1, 0, 2, -3, 0, -1, 1} and waveform 400b is input to multipliers $200_1$ and $200_2$.

Referring again to FIG. 3, the method then advances to step 320 where the tap measurement for the tap $T_1$ respective to the controller $C_1$ is extracted from the signal detected at step 300. In the present example discussed in conjunction with FIG. 6, this signal is extracted from detector-output waveform 400b using multiplier $200_1$ and integrator $208_1$ of each controller $C_1$. First, multiplier 200 multiplies the Walsh code output from Walsh code generator 204 with the detector-output waveform 400b. The product waveform is then presented to integrator 208, which sums each pulse in the waveform over the number chips in the Walsh code. The results from each integrator $208_1$, $208_2$ are represented on FIG. 6 as items $404b_1$ and $404b_2$, respectively.

Specifically, for controller $C_1$, since the detector-output 400b={-3, -1, 0, 2, -3, 0, -1, 1}, and since the output of Walsh-code generator $204_1$ $W_1$={1, -1, -1, 1, -1, 1, 1, -1}, then the output of multiplier $200_1$ can be represented as {-3, -1, 0, 2, -3, 0, -1, 1}×{1, -1, -1, 1, -1, 1, 1, -1}=(-3, 1, 0, 2, 3, 0, -1, -1). The result for integrator $208_1$ can be represented as $404b_1$=Σ(-3, 1, 0, 2, 3, 0, -1, -1)=1. Similarly, for controller $C_2$, 400b={-3, -1, 0, 2, -3, 0, -1, 1} and since the output of Walsh-code generator $204_2$ $W_2$={1, -1, 1, -1, 1, -1, 1, -1}, then the output of multiplier $200_2$ can be represented as {-3, -1, 0, 2, -3, 0, -1, 1}×{1, -1, 1, -1, 1, -1, 1, -1}=(-3, 1, 0, -2, -3, 0, -1, -1). The result for integrator $208_2$ can be represented as $404b_2$=Σ(-3, 1, 0, -2, -3, 0, -1, -1)=-9.

The method then advances to step 340 where the appropriate steering signal for the tap T respective to a given controller C is determined. Continuing with the above example being discussed with reference to FIG. 6, the result 404b for each integrator 208 is then passed to its respective adjuster 212. In this example, the result $404b_1$ produced by integrator $208_1$ was "1" and this value is passed to adjuster $212_1$. The result $404b_2$ produced by integrator $208_2$ was "-9", and this value is passed to adjuster $212_2$. In each case, the sign of the integrator output determines which way the respective tap T is adjusted.

As previously discussed, adjusters 212 include digital signal processing circuitry which is operable to make the determination of whether to steer the tap T based on the result 404b passed from its respective integrator 208. In the present embodiment, adjusters 212 are configured so that, if the received input from its respective integrator 208 does not equal "0", then it is determined that steering of its respective tap T is required. Accordingly, in the example of FIG. 6 adjusters $212_1$ and $212_2$ both determine that steering of the respective taps $T_1$, $T_2$ is required.

For controller $C_1$, adjuster $212_1$ has received a "1", and thereby determines that the tap steering signal $408b_1$ to tap $T_1$ should be increased and accordingly, the output tap steering signal $408b_1$ is increased by a predetermined increment from the previous signal that was used during the previous iteration through the method of FIG. 3. For controller $C_2$, adjuster $212_2$ has received a "-9", and thereby determines that the tap steering signal $408b_2$ to tap $T_2$ should be decreased and accordingly, the output tap steering signal $408b_2$ is decreased by a predetermined increment from the previous signal that was used during the previous iteration through the method of FIG. 3. Tap steering signals 408b are then presented to their respective summer 216, which sums the tap steering signal 408a with the respective attenuated Walsh code AW. Thus, each tap steering signal 408a and attenuated Walsh code AW are summed together by their respective summer 216, to create a dithered tap steering signal, indicated on FIG. 6 as items $412b_1$ and $412b_2$. The dithered tap steering signals 412b are then presented to their respective taps T of their respective GPA at step 360.

Iterations through the method of FIG. 3 repeat continuously for each controller C, increasing or decreasing each tap output signal 412 until an optimum level for a respective tap T is reached, at which point the respective controller C simply maintains the tap output signal 412 at its current level (i.e.—the result from integrator 208 of the product from multiplier 200 of waveform 400 and Walsh code W is "0") until, during a subsequent iteration through the method of FIG. 3, further steering of the respective tap T is required.

While the embodiments discussed herein are directed to specific implementations of the invention, it will be understood that combinations, sub-sets and variations of the embodiments are within the scope of the invention. For example, it will now be apparent to those of skill in the art that amplifier portion 24 is a substantially known configuration for one type of amplifier portion of a feed forward amplifier, yet other configurations of amplifier portion 24 are within the scope of the invention. Other such configurations are discussed in a co-pending U.S. patent application Ser. No. 09/715,085, assigned to the assignee of the present invention, the contents of which are incorporated herein by reference. In particular, this application teaches a feed forward amplifier with a single pilot tone generator receiver, which is also suitable for incorporation into the present invention. A general discussion of feed forward amplifiers instructive to those of skill in the art for the design of amplifier portions is discussed in U.S. Pat. No. 3,471,798, the contents of which are also incorporated herein by reference.

As will also be apparent to those of skill in the art, feed forward amplifiers can include more than two gain and phase adjusters. In such a case, a detector-controller circuit can be employed for each gain and phase adjuster and a separate orthogonal tracer signal employed for each tap T.

Further, while the embodiments discussed herein refer specifically to FFAs having a pilot tone, it is to be understood that the present invention is also applicable to FFAs that do not use pilot tone, but use some other method, for example such as measuring intermodulation energy at detector $D_2$.

While the embodiments discussed herein refer to gain and phase adjusters having gain and phase taps T, it is to be understood that the present invention is not so limited and can be applied to other types of adjusters, such as phase and gain adjusters having in phase "I" and quadrature "Q" taps. Furthermore, while the embodiments discussed herein refer to controlling gain and phase adjustments in FFAs, it is to be understood that the apparatus and method discussed herein can be modified for use with any appropriate circuit where adaptive control is used, such as feed forward circuits, etc.

It is also to be understood that while the embodiments discussed herein refer to Walsh codes, any type of orthogonal tracer-signal, such as suitable length pseudo noise sequences or the like can be used, with appropriate modifications to other aspects of the remainder of the circuit. Additionally, while the number of chips of the Walsh codes used in the exemplary embodiments discussed herein corresponds to the period of the pulse wave-form of the detector-output, it will be understood that these periods need not correspond at all. In general, it is to be understood that any means or method for extracting a particular tap measurement from a detector-output can be used, such as using frequency division multiplexing.

While presently less preferred due to increased complexity, it is contemplated that the magnitude of the output of integrator 208 could also be used to provide further information to determine the amount by which each tap T is to be steered, in addition to using the polarity of the integrated signal to determine the direction the tap T should be steered. In such as case, instead of adjusting the amount by a predetermined increment, a variable increment can be selected depending upon the magnitude of the output.

It is also contemplated that the size of the increment can vary, in a preselected manner, between start up of the adaptive circuit and normal operation of the adaptive circuit. For example, at start up and for a given number of iterations, amplifier 20 of FIG. 1 can employ an increment/decrement size of 5 units, followed by an increment/decrement size of 3 units for another given number of iterations, then followed by an increment/decrement size of 2 units for another given number of iterations, after which an increment/decrement size of 1 unit is employed. This should allow faster convergence of the amplifier at start up.

The present invention provides a novel feed forward amplifier that includes a method and apparatus for steering the gain and phase adjustment such that each tap within the gain and phase adjusters is adjusted at substantially the same time to converge towards an optimum operating setting. Convergence towards the optimum settings are therefore obtained substantially faster and/or more accurately than prior art feed forward amplifiers. Each tap can have a tracer signal, which is orthogonal to other tracer signals, injected into the signal paths through the amplifier. The respective tracer signal is extracted and employed by each tap controller to appropriately alter the tap control signals.

The above-described embodiments of the invention are intended to be examples of the present invention and alterations and modifications may be effected thereto, by those of skill in the art, without departing from the scope of the invention which is defined solely by the claims appended hereto.

I claim:

1. An adaptive circuit comprising:
   at least two adjusters, each adjuster including at least one control input to alter the operation of the circuit;
   at least one signal generator to create a plurality of tracer signals, each created tracer signal being orthogonal to each other created tracer signal, each tracer signal comprising a Walsh code;
   at least two controllers, each controller operable to output a control signal to at least a respective one of the control inputs of the at least two adjusters, a different orthogonal tracer signal from said at least one signal generator being applied to each respective control signal as a dither; and
   at least one detector operable to extract at least one orthogonal tracer signal from the circuit and to apply the extracted at least one orthogonal tracer signal to a respective one of the at least two controllers, each controller being responsive to the respective applied signal to alter the respective control signal to converge operation of the circuit to an optimal or near optimal configuration.

2. The adaptive circuit as claimed in claim 1, wherein said circuit comprises a feed forward amplifier.

3. The adaptive circuit as claimed in claim 2, wherein the at least two adjusters operate to adjust the phase and gain of a signal passed through them and each of the at least two adjusters includes a phase control input tap to control the phase adjustment and a gain control input tap to control the gain adjustment.

4. The adaptive circuit as claimed in claim 3, further including at least two detectors, each of the at least two detectors extracting at least two orthogonal tracer signals and applying the extracted orthogonal tracer signals to said at least two controllers.

5. The adaptive circuit as claimed in claim 3 wherein the orthogonal tracer signals comprise pseudo noise sequences.

6. A feed forward amplifier comprising:
   an amplifier portion including a coupler, first and second gain and phase adjusters, first and second delay elements, a main amplifier and a correctional amplifier, the coupler providing an input signal to said amplifier portion to a first signal path including the first gain and phase adjuster, the main amplifier and the first delay element and an output and the coupler providing the input signal to a second signal path including the second delay element, the second gain and phase adjuster and the correctional amplifier having a first signal path for carrying an input signal to a first gain-and-phase adjuster and a main-amplifier, said first gain-and-phase adjuster having a pair of taps for steering said first adjuster, said amplifier portion having a second signal path for carrying a sample of said input signal generated to a second gain-and-phase adjuster and a correctional-amplifier, said second gain-and-phase adjuster having a pair of taps for steering said adjuster; and a detector-controller portion having a first detector for receiving a detected signal from said first signal path and a second detector for receiving a detected signal from said second signal path, said detector-controller portion further comprising a first pair of controllers for receiving said detected signal from said first detector and a second pair of controllers for receiving said detected signal from said second detector, said controllers each operable to steer a respective one of said taps based on said received detected signals, each of said controllers further operable to inject orthogonal Walsh code tracer-signals into its respective tap, said tracer-signals for carrying through said amplifier portion and modulating said detected signals, said controllers each operable to extract from its respective detected signals a tap-signal by using its respective said tracer-signal, said controllers each further operable to utilize said extracted tap-signal to determine a desired direction for steering its respective tap and to output, substantially simultaneously with each other controller, a signal to steer said respective tap.

7. A feed forward amplifier comprising:

an amplifier portion including:
  (a) a first signal path having a first gain and phase adjuster, a main amplifier, and a delay element; and
  (b) a second signal path having a delay element, a second gain and phase adjuster, and a correctional amplifier, each gain and phase adjuster including a control input tap to accept an input to alter the phase response of the gain and phase adjuster and a control input tap to accept an input to alter the gain response of the gain and phase adjuster, the first and second signal paths having a common signal input and a common signal output; and a detector portion including:
  (c) a first detector to receive a signal from the common signal output and to provide the received signal to a first controller operable to create an input to the gain tap of the second gain and phase adjuster and to provide the received signal to a second controller operable to create an input to the phase tap of the second gain and phase adjuster; and
  (d) a second detector to receive a signal from the second signal path before the second gain and phase adjuster and to provide the received signal to a first controller operable to create an input to the gain tap of the first gain and phase adjuster and to provide the received signal to a second controller operable to create an input to the phase tap of the first gain and phase adjuster, each controller responsive to a component in said received signals which is orthogonal to the components to which each other controller are responsive to and all the created inputs being applied to the taps substantially simultaneously and altering the operation of said feed forward amplifier to linearize the amplification of the input signal through the feed forward amplifier, wherein said orthogonal components are Walsh coded.

8. A feed forward amplifier comprising:

an amplifier portion including:
  (a) a first signal path having a first gain and phase adjuster, a main amplifier, and a delay element; and
  (b) a second signal path having a delay element, a second gain and phase adjuster, and a correctional amplifier, each gain and phase adjuster including a control input tap to accept an input to alter the phase response of the gain and phase adjuster and a control input tap to accept an input to alter the gain response of the gain and phase adjuster, the first and second signal paths having a common signal input and a common signal output; and a detector portion including:
  (c) a first detector to receive a signal from the common signal output and to provide the received signal to a first controller operable to create an input to the gain tap of the second gain and phase adjuster and to provide the received signal to a second controller operable to create an input to the phase tap of the second gain and phase adjuster; and
  (d) a second detector to receive a signal from the second signal path before the second gain and phase adjuster and to provide the received signal to a first controller operable to create an input to the gain tap of the first gain and phase adjuster and to provide the received signal to a second controller operable to create an input to the phase tap of the first gain and phase adjuster, each controller responsive to a component in said received signals which is orthogonal to the components to which each other controller are responsive to and all the created inputs being applied to the taps substantially simultaneously and altering the operation of said feed forward amplifier to linearize the amplification of the input signal through the feed forward amplifier, wherein said orthogonal components comprise pseudo noise sequences.

9. A method for operating an adaptive control circuit having a plurality of control input taps, said method comprising, for each said control input, the steps of:

detecting a signal, including a tracer signal, from said circuit;

extracting a measurement from the tracer signal in said detected signal;

control determining an appropriate input to be applied to said control input to improve operation of said adaptive circuit;

creating a tracer signal for said control input, said created tracer signal comprising a Walsh code that is orthogonal to the tracer signals created for each other control input; and combining said tracer signal and said determined input and applying the resulting signal to said control input.

10. The method according to claim 9 wherein said adaptive control circuit comprises an amplifier portion of a feed forward amplifier having a pair of input control taps for a first gain-and-phase adjuster and a second pair of control input taps for a second gain and phase-adjuster.

11. The method according to claim 9 wherein said tracer signals comprise pseudo noise sequences.

* * * * *